United States Patent [19]

Horsten

[11] 4,031,523

[45] June 21, 1977

[54] INTEGRATED STORAGE SYSTEM WITH PARALLEL CONNECTION LINES CONTAINING A RESISTOR

[75] Inventor: Johannes Bernardus Horsten, Eindhoven, Netherlands

[73] Assignee: U.S. Philips Corporation, New York, N.Y.

[22] Filed: Oct. 7, 1975

[21] Appl. No.: 620,301

Related U.S. Application Data

[63] Continuation of Ser. No. 500,951, Aug. 27, 1974, abandoned.

[30] Foreign Application Priority Data

Sept. 11, 1973 Netherlands .................. 7312487

[52] U.S. Cl. ................. 340/173 R; 340/174 AD
[51] Int. Cl.² ................ G11C 5/06; G11C 7/00
[58] Field of Search ... 340/173 R, 174 AD, 174 DC, 340/173 FF

[56] References Cited

UNITED STATES PATENTS

| 3,360,786 | 12/1967 | Steele et al. | 340/174 AD |
| 3,727,188 | 4/1973 | Horsten | 340/166 R |

OTHER PUBLICATIONS

Moore et al, Monolithic Memory Restore Circuit Pair, IBM Technical Disclosure Bulletin, vol. 14, No. 6, Nov. 1971, pp. 1687–1688.

*Primary Examiner*—Stuart N. Hecker
*Attorney, Agent, or Firm*—Frank R. Trifari; Daniel R. McGlynn

[57] ABSTRACT

A storage device, in particular a storage device composed of integrated circuits, comprising a number of multi-element stores and a drive unit which is connected to the multi-element stores via a number of parallel connection lines. The connection lines incorporate a series resistance device and a junction. Branch lines incorporating each time a series resistor as part of said series resistance device are connected between the junctions and groups of multi-element stores.

6 Claims, 3 Drawing Figures

INTEGRATED STORAGE SYSTEM WITH PARALLEL CONNECTION LINES CONTAINING A RESISTOR

This is a continuation, of application Ser. No. 500,951, filed Aug. 27, 1974 and now abandoned.

The invention relates to a storage device, notably a storage device composed of integrated circuits, comprising a number of multi-element stores and a drive unit which is connected, via a number of parallel connection lines, to the multi-element stores, the connection lines incorporating a series resistance device. Storage devices of this kind are known. The integrated circuits may be MOS circuits. The multi-element stores comprise, for example, $2^{10}$ bit locations, so that ten connection lines are required for selecting a bit location. Each multi-element store comprises, for example, one bit of a word to be selected. The known storage device comprises a series resistor per connection line. This resistor determines the steepness of the pulse edges. The connection lines have a mutual capacitance, which produces cross-talk. The capacitance is localized in or near the multi-element stores. If no further steps are taken, the interference in each multi-element store is similar. The interferences can be summed, which is objectionable in the case of long words. In given circumstances the cross-talk signals thus generate a pseudo drive signal. The wrong word or an incorrect bit location is then selected.

Other selection pulses can aslo initiate the cross-talk. Notably in MOST stores this may be by the clock pulse line. This line has a capacitance with respect to the said selection lines. In the case of long words a pseudo selection signal can then also be generated. Other selection pulses such as the enable pulses, however, can also be the cause thereof. The word length can always be limited, and a larger number of drive units can be used in parallel. The cross-talk is then summed over a smaller number of bits. However, this solution increases the cost. The present invention offers a favorable solution in that it is characterized in that the connection lines comprise a junction, branch leads incorporating each time a series resistor as part of the series resistance device being connected between the junctions and groups of multi-element stores. So as to be summed still, the interference peaks must each time pass the series resistors in two branch lines with the result that they are attenuated. It was found as an additional advantage that the pulse edges in the selection lines can now be steeper. This increases the speed of the storage device.

The invention will be described in detail hereinafter with reference to the figures.

Figure 1:
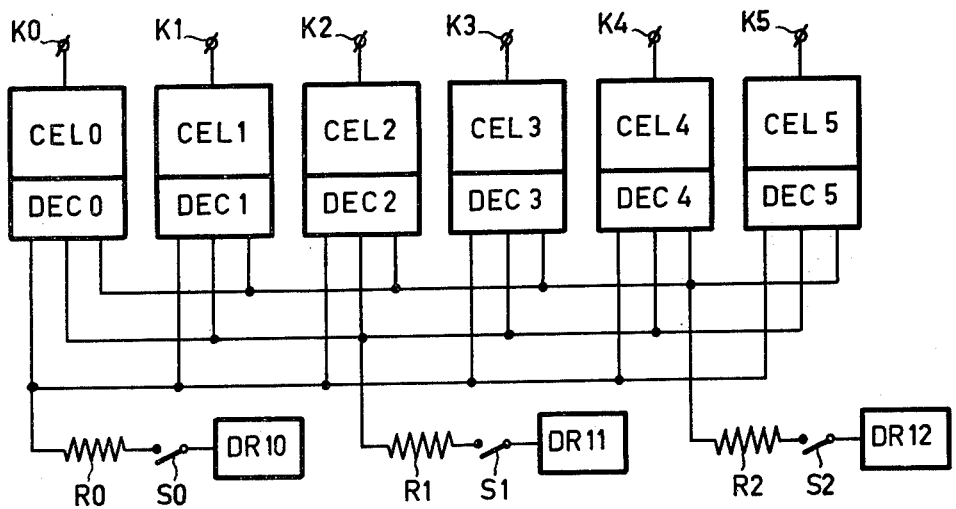
FIG. 1 shows a storage device according to the present state of the art.

FIG. 1 shows a storage device according to the present state of the art. The storage device comprises six multi-element stores CEL 0 . . . 5. Such integrated solid-state stores are known and have a capacity of, for example, 4096 bits. In this simple example they contain 8 bits each. For the selection of a bit three binary signals are required which arrive via the leads 0, 1, 2, at the decoder DEC 0 . . . 5 which forms a one-out-of-eight code. If switch S 0 is closed, drive element DRI 0 supplies a binary 1-signal on line 0 via the resistor R 0. If the switch S 0 is open, however, this is a binary 0. Corresponding elements have been provided for the lines 1 and 2. The resistors R 0 . . . 2 can serve to improve the shape of the drive pulses. For example, they can each time form part of RC-networks. The capacitance is then formed, for example, by the capacitance between the line and ground. The drive unit can comprise further components such as a three-bit input address register, clock pulse input terminals and read write selection input terminals which have been omitted for the sake of simplicity. In reaction to a read signal, information output signals appear on the terminals K 0 . . . 5 which produce, for example, a word consisting of six bits. In a write operation these, or other terminals (not shown), can receive information input signals. The storage device operates properly, but has one drawback. The lines 0 and 1 have an inter-line capacitance which is mainly localized in the decoders DEC 0 . . . 5. As a result, cross-talk occurs between the lines 0 and 1. If the delay times in the lines are small, the interference can be summed, notably because the decoders DEC 0 . . . 5 are all of a similar construction. The interference can be reduced by increasing the rise time of the drive signals or by imposing an upper limit as regards the number of stores, i.e. as regards the length of the storage words to be used. However, if this is not done, in given circumstances the interference can be summed such that an incorrect drive signal appears on a line, for example, a 1 instead of a 0. In that case an incorrect word is selected. It is alternatively possible that only in one or in a few of the stores CEL 0 . . . 5 an incorrect element is selected because the discrimination thresholds of the decoders DEC 0 . . . 5 exhibit a spread. On the basis of FIG. 3 another mechanism will be described by which incorrect selection can occur under the present state of the art.

Figure 2:
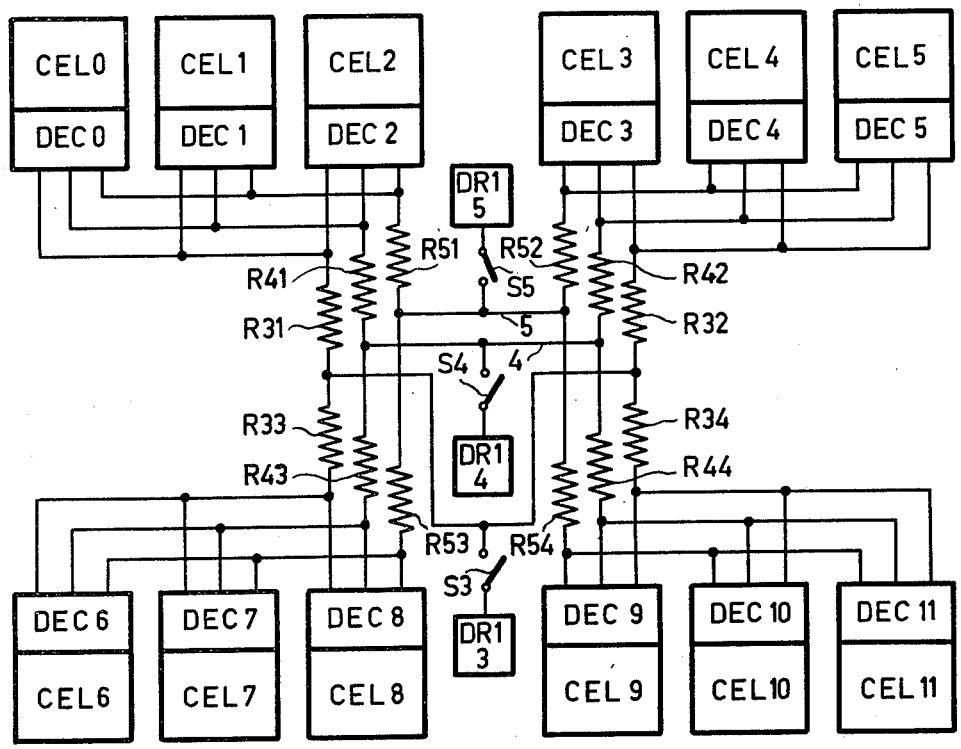
FIG. 2 shows a storage device according to the invention.

FIG. 2 shows a storage device according to the invention. Corresponding components have been denoted as in FIG. 1. In this case there are twelve multi-element stores CEL 0 . . . 11 with decoders DEC 0 . . . 11, three drive units DRI 3, 4, 5 with switches S 3, 4, 5. Further components of the drive unit have been omitted for the sake of simplicity. The connection line 3 incorporates four series resistors R31, 32, 33, 34 which are star-connected with respect to the switch S 3. A junction is thus formed. The series resistor R 31 is connected in the connection line to the stores CEL 0, 1, 2. The series resistor R 32 is connected in the connection line to the stores CEL 3, 4, 5, and so on. The number of stores per series resistor may differ. As was previously described, capacitive cross-talk again occurs, but the effect thereof is less. The value of the resistors R 31 . . . R 54 is high with respect to the internal resistance of the drive elements DRI 3, 4, 5. These two resistors each time constitute a voltage divider.Consequently, only a small part of the interference voltage arrives at the relevant junctions. In order to reach the stores of a different group of in this case three stores, the interference must pass a further series resistor. The interference can thus be attenuated again. In this manner the interference pulses are summed as shown in FIG. 1 within one group of stores, for example, CEL 0, 1, 2. The effect of interference pulses on the stores of other groups, however, is now substantially reduced. The amplitude of the ultimate interference pulse is now limited. As a result, fast rise times and/or large numbers of bits per storage word are permissible.

It is known per se to utilize a resistor in a one-bit storage element so as to improve the susceptibility to interference. A construction of this kind can also be used in a storage device according to the invention. In contrast therewith it is the principle of the invention according to render interference which has once been generated substantially harmless by the use of a voltage divider. According to the known technique, the capacitive cross-talk between, for example, a clock pulse line and a storage element can remain.

According to the invention the series resistors are arranged in a connection line separate from the storage elements. As a result, the number of resistors used is also much smaller than the number of bit locations in the device (in the example 12 versus 96: when use is made of 1024-bit stores and a word length of 32 bits, for example, 40 versus 32768). A small number of resistors is advantageous. In integrated resistors a small substrate surface area is then required. In discrete resistors only few separate elements need be used. Furthermore, it can be decided at a later stage as to how many stores are assembled to form a storage device.

Figure 3:
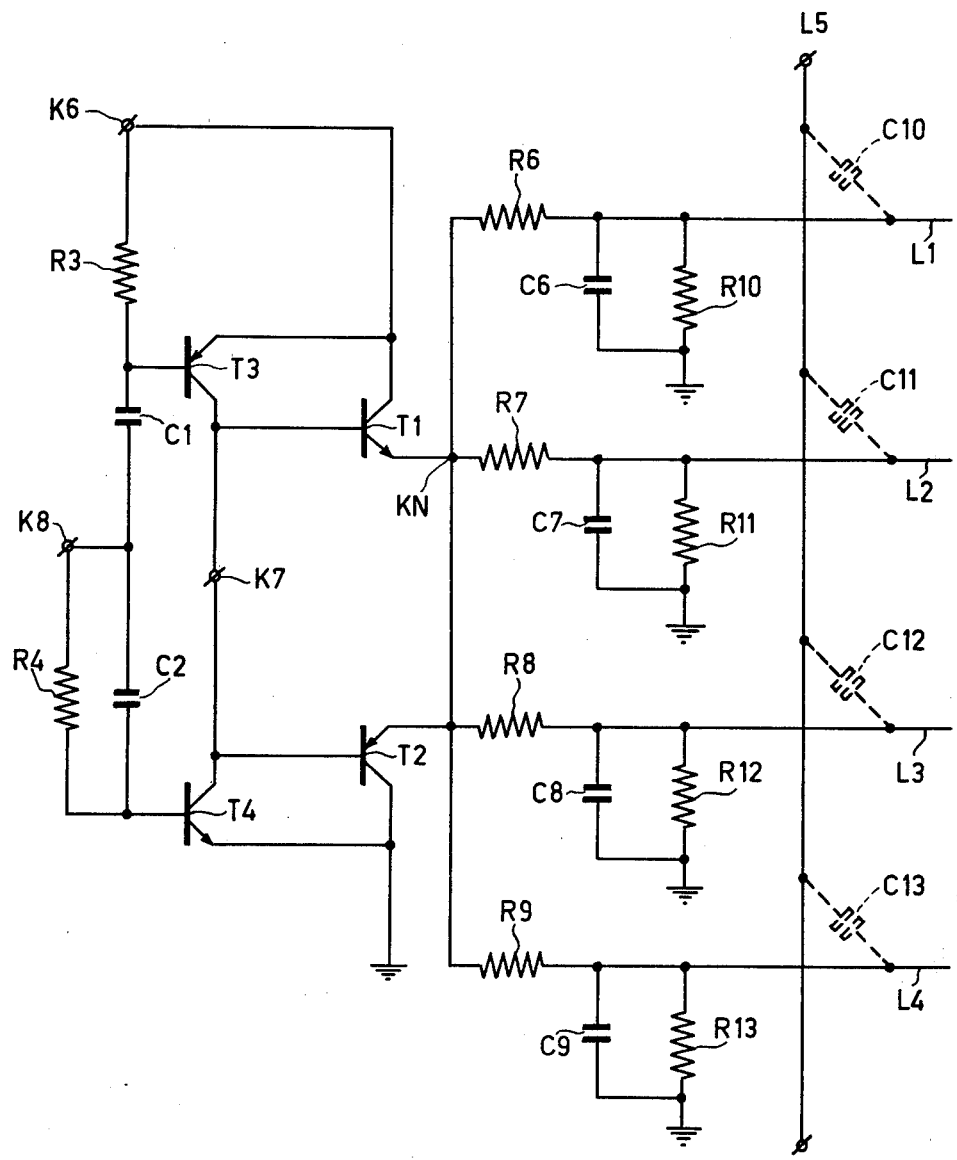
FIG. 3 shows a few details relevant to the invention.

FIG. 3 shows some details relevant to the invention. For the sake of simplicity only one drive unit is shown, for example, corresponding to DRI 3 of FIG. 2. The connection line incorporates a junction KN. The drive unit comprises four transistors T 1 . . . 4, two resistors R 3 . . . 4 two capacitors C 1, 2 and three connection terminals K 6, 7, 8. The connection terminal K 7 is to be connected to a positive voltage. The connection terminal K 8 is a signal input terminal which is normally at a low potential. Consequently, the transistor T4 is cut off so that the base voltage of the transistor T2 is high. The transistor T2 is then also cut off. The base voltage of the transistor T 1 is then also high, with the result that this transistor is conductive, and so is the transistor T 3. The junction KN is then at a high potential. When the signal input terminal K 8 is at a high potential, the transistors T 2 and T 4 are conductive, while the transistors T 1 and T 3 are cut off. The capacitors C 1 and C 3 form part of differentiating networks (incorporating the resistors R 3, 4). As a result, the change-over of the conductivity state of the transistors T 1, 2 is accelerated. This mechanism is described in more detail in U.S. Pat. No. 3,727,188 issued Apr. 11, 1973.

The device furthermore comprises eight resistors R 6 . . . 13, eight capacitors C 6 . . . 13, and five lines L 1 . . . 5. The operation of the resistors R 6 . . . 9 corresponds to that of the resistors R 31 . . . 34 of FIG. 2. The loading by the stores (for example, CEL 0 . . . 11 of FIG. 2) is symbolized by the resistors R 10 . . . 13 and the capacitors C 6 . . . 9. The other connection lines to these stores can duplicate the pattern of FIG. 3. Line 5 is a clock pulse line. In the case of a store operation, clock pulse signals appear on L 5, whether or not together with selection signals on the lines L 1 . . . 4. Parasitic capacitances C 10 . . . 13 exist between the lines L 1 . . . 4 and the line L 5. As a result, cross-talk from L 5 to L 1 . . . 4 occurs. Each store simultaneously receives a clock-pulse signal (CEL 0 . . . 11 in FIG. 2). The interference is thus summed for all stores connected to the line L 1. The clock line L 5 is shown to be of a single construction for the sake of simplicity. The lines L 1 . . . 4 also have parasitic capacitances with the corresponding lines of other drive units. This has already been discussed with reference to FIG. 2. The resistors R 6 . . . 9 and the (low) internal resistance of the drive unit (transistors T1, 2, etc.) constitute a voltage divider, so that only a small part of the interference voltage per line (L 1 . . . 4) arrives at the junction. The mutual influencing of the interference on the lines L 1 . . . 4 is therefore small. The interference is each time added on the clock pulse line (for example, initiated by the selection pulse on the terminal K 8), but this is not disturbing because the clock pulse is always present. The selection pulse on the terminal K 8 depends on the code of the bit location in the stores to be selected, for example, CEL 0 . . . 11 of FIG. 2.

A further advantage of a storage device according to the invention is the following. In FIG. 1 the resistor R O constitutes an integrating RC network together with the parallel connected capacitances per store between the line 0 and ground. In a configuration as shown in FIG. 3, these are the capacitances C 6 . . . 9. This capacitance is distributed among the branch lines. The resistive loading by the stores is embodied in the resistors R 10 . . . 13. The resistive load per branch line is now smaller than in a configuration as shown in FIG. 1. It was found to be unnecessary to increase the value of R 6 . . . 9 inversely proportionally to the load capacitance per line. The RC integration time per line is thus reduced. As a result, the pulse edges may be steeper and the storage device may be faster.

What is claimed is:
1. A memory system comprising
 a plurality of bit-organized storage cells, each cell storing a plurality of bits;
 a first network of first connecting lines connecting said storage cells, each one of said lines including a first junction point with at least another one of said lines, and a resistor connected in series with said one line;
 a plurality of drive units for supplying signals to said storage cells; and
 a second network of second connecting lines for connecting each of said drive units with at least one second junction point, said at least one second point being connected with said resistor of each respective one of said first connecting lines connected to said at least one second junction point
 a plurality of decoders, each one of said decoders being operatively associated with a respective one of said storage cells,
 a plurality of switches, each of said switches being in series with a respective one of said drive units,
 a clock pulse line associated with said storage cells, and a parasitic capacitance in each respective one of said decoders between each of said first connecting lines and said clock pulse line.

2. A memory system as defined in claim 1, wherein the number of resistors is fewer than the number of bit locations in the memory system.

3. A memory system as defined in claim 1, wherein said memory system is fabricated as an integrated circuit.

4. A memory system as defined in claim 1, where said drive unit comprises transistors, each of said transistors having an emitter; said second junction point being connected to one of said emitters.

5. A memory system as defined in claim 1, further comprising a plurality of capacitors connected between each respective one of said first connection line and ground; whereby said first network forms an integrating RC network with a minimal integration time per first connection line.

6. A memory system comprising
a plurality of bit-organized storage cells, each cell storing a plurality of bits;
a first network of first connecting lines connecting said storage cells, each one of said lines including a first junction point with at least another one of said lines, and a resistor connected in series with said one line;
a plurality of drive units for supplying signals to said storage cells; and
a second network of second connecting lines for connecting each of said drive units with at least one second junction point, said at least one second point being connected with said resistor of each respective one of said first connecting lines connected to said at least one second junction point; and
a plurality of capacitors connected between each respective one of said first connection line and ground; whereby said first network forms an integrating RC network with a minimal integration time for each first connection line.

* * * * *

UNITED STATES PATENT AND TRADEMARK OFFICE
CERTIFICATE OF CORRECTION

PATENT NO. : 4,031,523
DATED : June 21, 1977
INVENTOR(S) : JOHANNES BERNARDUS HORSTEN It is certified that error appears in the above-identified patent and that said Letters Patent are hereby corrected as shown below:

Column 1, line 30, "aslo" should be --also-- line 40, "The present invention offers a favor-" should begin a new paragraph line 68, "1-signal" should be --"1"-signal--

Column 2, line 1, "binary 0" should be --binary "0"-- line 29, "1 instead of a 0" should be --"1" instead of a "0"--

Signed and Sealed this

Fourth Day of October 1977

[SEAL]

Attest:

RUTH C. MASON
*Attesting Officer*

LUTRELLE F. PARKER
*Acting Commissioner of Patents and Trademarks*